United States Patent [19]
Hayashi

[11] Patent Number: 5,994,758
[45] Date of Patent: Nov. 30, 1999

[54] SEMICONDUCTOR INTEGRATED CIRCUIT DEVICE HAVING RESISTANCE ELEMENT

[75] Inventor: Shigeru Hayashi, Tokyo, Japan

[73] Assignee: NEC Corporation, Tokyo, Japan

[21] Appl. No.: 08/993,558

[22] Filed: Dec. 18, 1997

[30] Foreign Application Priority Data

Dec. 20, 1996 [JP] Japan .................................. 8-341390

[51] Int. Cl.[6] .................................................. H01L 29/00
[52] U.S. Cl. ........................... 257/536; 257/420; 438/382
[58] Field of Search .................................. 257/536, 420; 438/382

[56] References Cited

U.S. PATENT DOCUMENTS 4,423,434  12/1983  Komatsu .................................. 257/536

FOREIGN PATENT DOCUMENTS

| | | |
|---|---|---|
| 57-10946 | 1/1982 | Japan . |
| 57-31167 | 2/1982 | Japan . |
| 63-67765 | 3/1988 | Japan . |

*Primary Examiner*—Mark V. Prenty
*Attorney, Agent, or Firm*—Foley, Hoag & Eliot LLP

[57] ABSTRACT

A functional circuit group consisting of a plurality of functional circuits is formed at a surface of a substrate and a resistance element group consisting of a plurality of resistance elements connected to the functional circuits is arranged outside the functional circuit group on the substrate. The resistance element group is arranged in a region extending from an inner line, which is distant by one-third of a distance between the outer edge of the substrate and the center thereof from the same outer edge, up to the same outer edge. The resistance element group is a group in which a plurality of resistance elements, each having the same shape and size, are arranged at a constant distance between two of any adjacent pair.

16 Claims, 5 Drawing Sheets

SEMICONDUCTOR INTEGRATED CIRCUIT DEVICE HAVING RESISTANCE ELEMENT

BACKGROUND OF THE INVENTION

1. Field of the Invention

The present invention relates to a semiconductor integrate circuit device having a resistance element capable of reducing a dispersion of resistance values among resistance elements.

2. Description of the Related Art

Conventionally, a general semiconductor integrated circuit device of a packaging structure has a silicon chip mounted on a lead frame and molded by a resin. In the semiconductor integrated circuit device, since a silicon chip, lead frame, mount material and molding resin have mutually different thermal expansion coefficients, the silicon chip receives a stress from the lead frame, mount material and molding resin and so forth. Especially after the silicon chip is molded by the resin, the resin contracts in the course of cooling, and thus there arises a compressive stress working from the exterior to the interior of the chip which is as large as in the range of tens to hundreds of MPa.

FIG. 1 is a graph showing a relation of the stress imposed on a chip with the distance from the center of the chip, wherein the stress is represented by a ordinate and the distance is represented by an abscissa. In FIG. 1, a solid line shows a compressive stress and a broken line shows a shearing stress. As shown in FIG. 1, the compressive stress occupies a greater part of the total stress imposed on the chip and has the maximum in the central portion, whereas it is decreased as a measuring point is closer to the periphery of the chip. A changing rate of the compressive stress on the distance is smaller in the central portion but it is drastically enlarged as a measuring point is closer to the periphery of the chip.

On the other hand, as shown by a broken line in the figure, the shearing stress imposed on the chip grows larger as a measuring point is closer to the periphery of the chip. An increment of the shearing stress in the peripheral region offsets the decrease in compressive stress there. As a result, a changing rate of the total stress imposed on the chip on the distance is the smallest in a central region from a line locating at a distance of about one-third of a distance from the center of the chip to the edge thereof. The second smallest of the changing rate is in a peripheral region of the chip with its innermost boundary extending from the same outer edge of the chip to about one-third of a distance from the center of the chip to the outer edge thereof. In the residual region, the changing rate is the maximum.

The stress generating in the interior of the chip is greatly different in magnitude according to a size thereof, a material of a lead frame, an area of an island and a thickness and area of a molding resin.

It is well known that when a stress is externally imposed on a silicon substrate, a change in an average bond distance between silicon atoms affects an energy band structure of silicon, so that an electric conductivity is increased. A resistance value of a diffused resistor formed in a silicon substrate by introducing an impurity therein is changed by a stress generated by an external cause (in general, the resistance value is decreased). This phenomenon is called Piezoresistance Effect.

FIG. 2 is a plan view showing a chip of a conventional semiconductor integrated circuit device. This is hereinafter referred to as the first prior art. As shown in FIG. 2, an array 12 of two resistors each having a rectangular shape parallel to a pair of opposed sides of a chip are arranged in the peripheral region of a substrate 11. An array 13 of two resistors parallel to the array 12 of two resistors is located in a central region with each having a position closer to the center than each of the array 12 of resistors. Functional circuits (not shown) which are connected to the arrays of resistors 12, 13, are formed at the surface of the substrate 11 and thus the chip 14 is constituted.

In the first prior art with such a constitution, the array 13 of resistors has an imposed stress higher on the average than that of the array 12 of resistors and the resistance value is drastically decreased after assembling. Even in the array 13 of resistors, a central portion of the chip 14 is different in decrease of a resistance value from a peripheral portion thereof.

In such a manner, when a resin mold type package is formed, resistance value of a resistance array is different between before and after the package assembling. In a definite manner, a resistance value after the assembling is decreased by about 0 to 10%, compared with a resistance value before the assembling and especially in a portion where the strongest stress is imposed, a resistance value is conspicuously changed.

In order to reduce a influence of Piezo Effect, there have been proposed a various integrated circuit device (see publications of Unexamined Japanese Patent Application No. Sho 57-31167 and Unexamined Japanese Patent Application No. Sho 63-67765). These techniques disclosed in the publications are hereinafter referred to as the second and third prior arts.

FIGS. 3A and 3B are plan views respectively showing configuration of resistance elements according to the second and third prior arts, wherein FIG. 3A shows resistance elements arranged in a peripheral region of a substrate and FIG. 3B shows resistance elements arranged in the vicinity of a corner region of the substrate. As shown in FIGS. 3A and 3B, resistance elements 22, 23, 24 and 25 each extending in a rectangular shape are arranged in regions of a substrate 21. For example, the resistance elements 22, 23, which are required so that a ratio of resistances is always constant, are arranged in parallel to each other. Moreover, in this example, lines which respectively bisect the resistance elements 22, 23 lengthwise both coincide with an arbitrary line Xc perpendicular to an x direction shown in FIG. 3A.

Besides, as shown in FIG. 3B, the resistance elements 24, 25 arranged around the corner of the substrate 21 are also arranged in parallel to each other. Lines bisecting the resistance elements 24, 25 lengthwise both coincide with a diagonal 26 of the substrate 21.

In the chip 27 in which resistance elements are arranged in such a way, since a rate of change in resistance for each resistance element of a pair is equal to the other, resistance ratios between before and after adhering of the chip 27 to a package are equal.

However, since there is a need that lines bisecting two in-parallel arranged resistance elements are coincide with each other in the second prior art, positioning of resistance elements on the substrate 21 is difficult. Especially when each of the pairs of resistance elements 22, 23, 25, 26 are constituted with a plurality more than two of resistance elements, it is difficult to connect between resistance elements respectively belonging to any arbitrary pair, so that a problem arises that a design of elements is complicated.

In the third prior art, resistance elements are arranged in a central region of a chip. In an integrated circuit device constituted in such a way, since resistance elements are arranged in the central region of the chip where a rate of change in stress with a change in distance from the center of the chip is smaller, a dispersion of resistance values in one chip can be resulted in reduction thereof. However, a resistance value itself of a resistance element is subjected to a large change after a chip is adhered to a package, compared with that of the resistance element before the adhesion of the chip.

A resistance element incorporated in, for example, a comparator or the like among those formed in an analogue type IC and the like has a requirement especially for a control of a resistance value with high accuracy. However, if a resistance value after assembling of a package is desired to be controlled with high accuracy, a design for resistance elements has to be made in consideration of a resistance dispersion in a fabrication and such a design is extremely difficult in execution and at the same time increases the number of process steps in the fabrication.

There is available a thin-film resistor as a resistance element with high accuracy in resistance value. However, since the thin-film resistor requires an apparatus and process steps, both special, for formation thereof, it has not widely been popular.

On the other hand, a method wherein a diffused resistor is formed by introducing an impurity in a surface region of a semiconductor substrate is widely used due to simplicity of fabrication thereof and a resistance layer having high accuracy is formed by adopting this diffused resistor. However, there is a limit of ±5% for reduction of a dispersion of resistance values of resistors each after the completion of diffusion process when resistance layers are formed with a diffusion resistor. Therefore, in order to control a dispersion of resistance values after the completion of diffusion process steps within a tolerance ±5%, there is a need for an assembly process to be carried out in such a manner that a dispersion of resistance values in the assembly process of a package is reduced to be as small as possible.

Since a magnitude of change between before and after the assembly process is different by a different kind of package, it is extremely difficult to estimate a correct magnitude of change in a designing stage. Since an IC such as a gate array generally has a configuration of a plurality of chips of different sizes on an IC substrate, differences in change of resistance value caused by differences in ship size cannot either be neglected. Therefore, to minimize a difference between before and after the assembly process is more required than to reduce dispersion between resistance elements in one chip.

SUMMARY OF THE INVENTION

The present invention has an object to provide a semiconductor integrated circuit device capable of not only reducing a change between resistance values of a diffused resistor before and after an assembly process of a package but improving uniformity of resistance values within one chip.

A semiconductor integrated circuit device having a resistance element according to the present invention has a substrate, a functional circuit group consisting a plurality of functional circuits and a resistance element group consisting of a plurality of resistance elements connected to the functional circuits. The functional circuit group is formed in a central region of the surface of the substrate and the resistance element group is arranged outside the functional circuit group at the surface of the substrate.

The resistance element group is preferably arranged in a region closer to the functional circuit group than to the outer edge of the substrate and besides, a region in which the resistance element group is arranged desirably extends from an inner line distant by one-third of a distance between the outer edge of the substrate and the center thereof from the same outer edge up to the same outer edge.

Resistance element group can be arranged on a parallel line with the outer edge of the substrate and the resistance element groups may be arranged along lines parallel to the outer edge of the substrate each taking positions on the inner and outer sides relative to the line alternately. The resistance elements which a resistance element group has are preferably arranged at a constant distance between two of an adjacent pair and more desirably, each has the same shape and size.

Resistance elements may independently be formed instead of being arranged as a member of a resistance element group.

According to the present invention, resistance elements on the substrate are arranged in a region outside the functional circuits, said region being in the vicinity of the outer edge of the substrate and thus a chip is constituted. Since the region is a region where an influence of a piezoresistance effect is the smallest in the chip, a change in resistance value between before and after an assembly process can be minimized if the region is selected for fabrication of resistance elements.

Furthermore, according to the present invention, dispersion between resistance element groups can also be reduced if the groups each are arranged on a parallel line to the outer edge of the substrate. Still furthermore, if a resistance element group is arranged in a region extending from an inner line, which is distant by one-third of a distance between the outer edge of the substrate and the center thereof from the same outer edge, up to the same outer edge, a dispersion of resistance values in the chip can be further smaller, since this region is a region where a change in resistance value with respect to a distance from the center of the chip is the smallest in the chip.

Besides, according to the present invention, if sizes and shapes of resistance elements are equal to one another or if resistance elements are arranged with a high density and a distance between resistance elements of an adjacent pair is constant, not only resistance value of each resistance element is reduced but a dispersion of resistance values can be decreased.

DETAILED DESCRIPTION OF THE PREFERRED EMBODIMENTS

Figure 1:
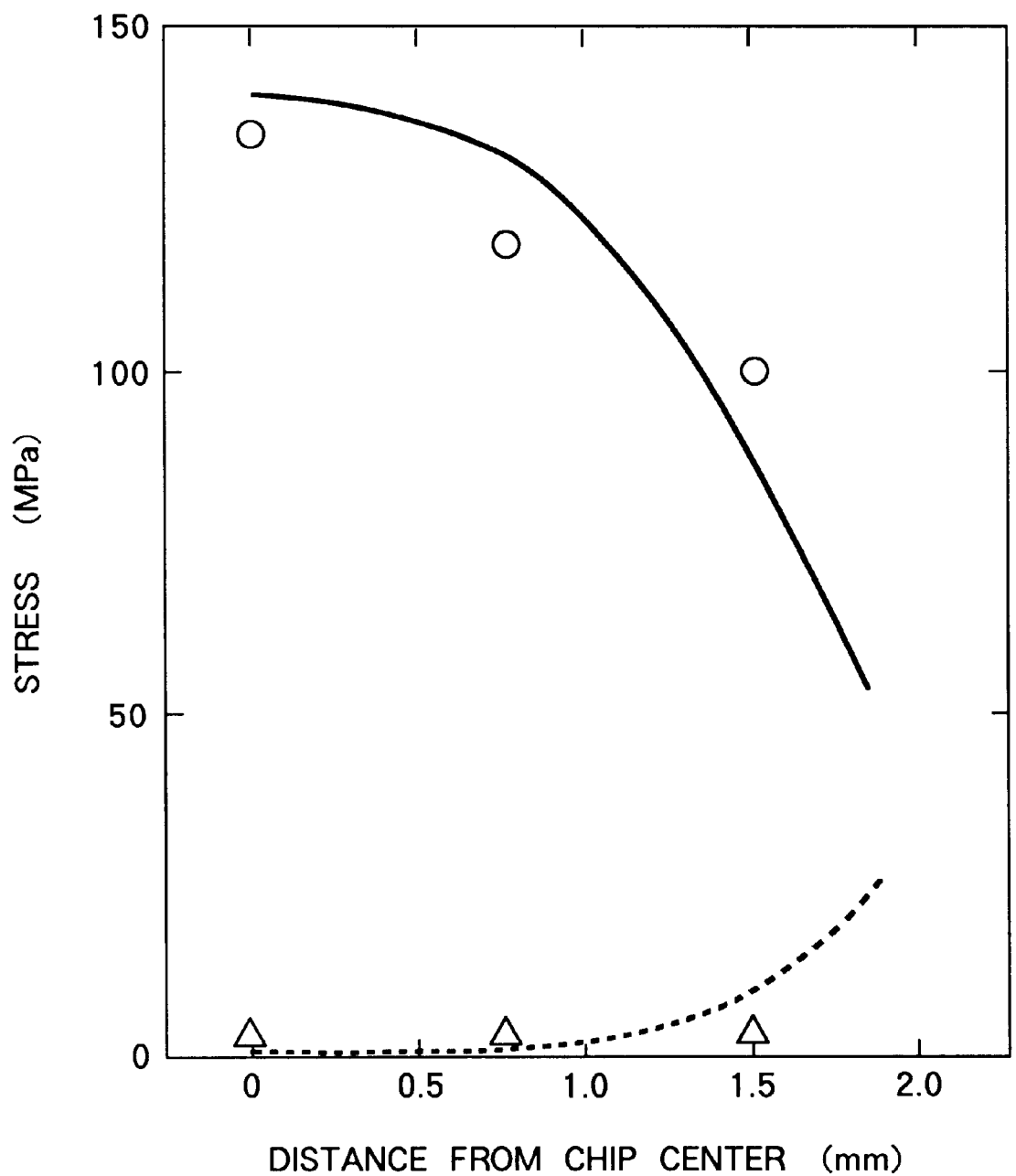
FIG. 1 is a graph showing a relation between the stress imposed on a chip and the distance from the center thereof, wherein the abscissa is used for plotting values of the distance from the center of the chip and the ordinate is used for plotting respective values of the stress at positions corresponding to the values of the distance.
Figure 2:
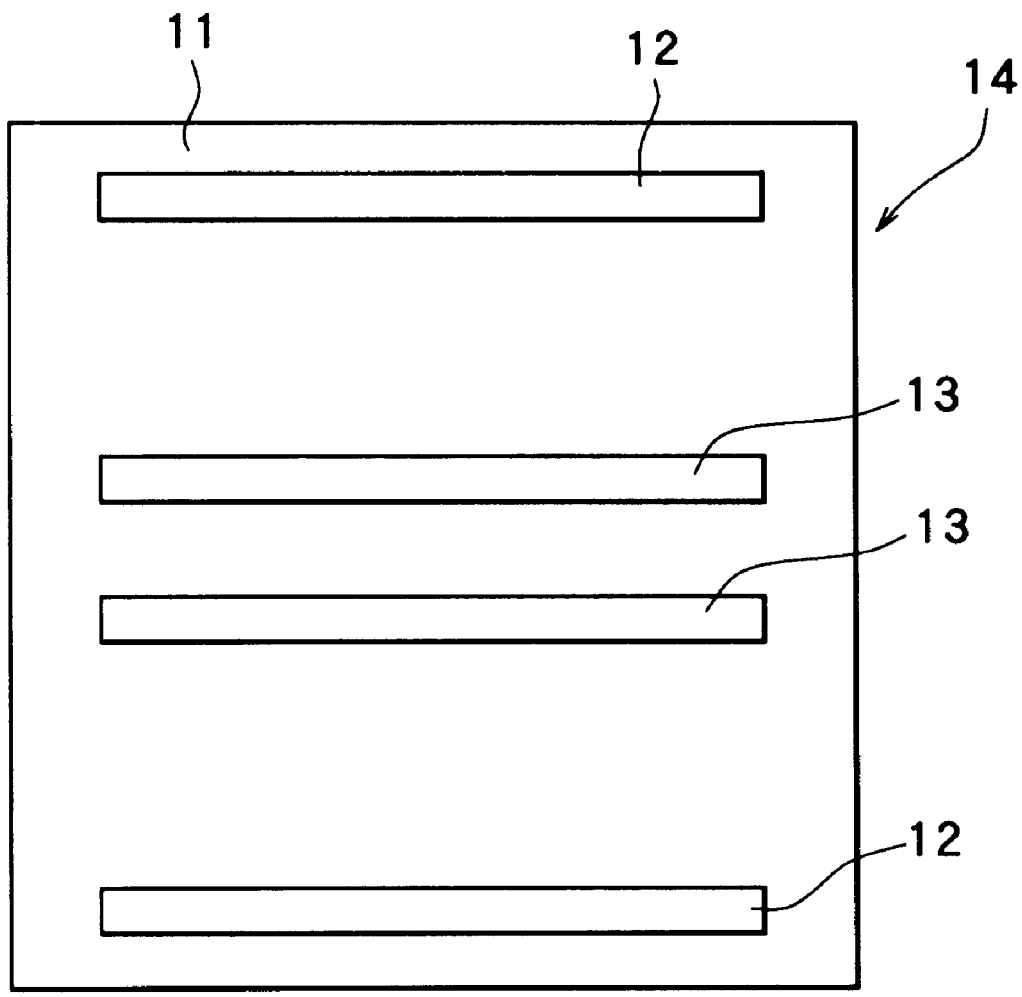
FIG. 2 is a plane view showing a chip of a conventional semiconductor integrated circuit device.
Figure 3A:
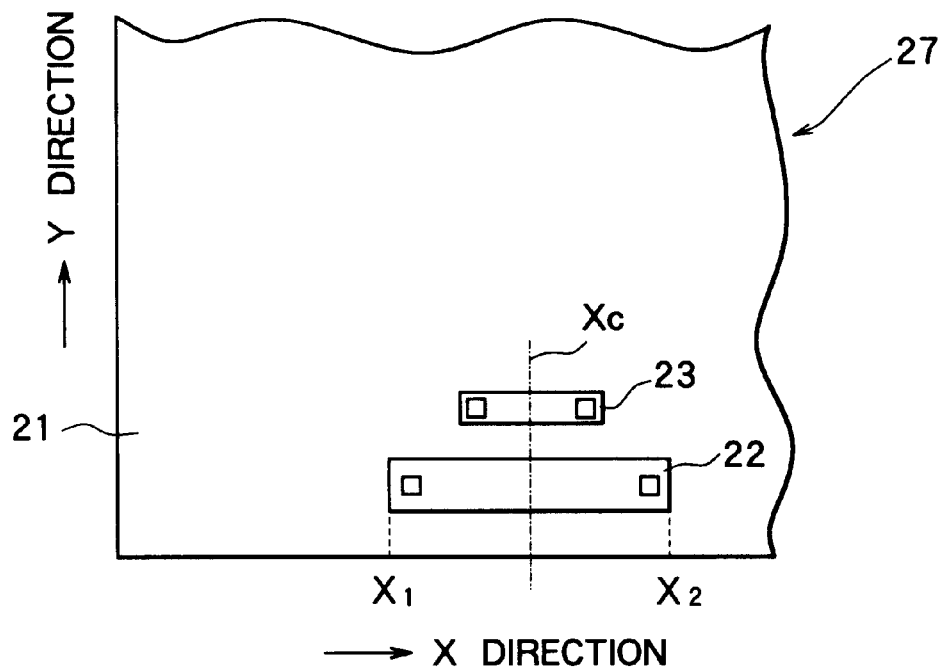
FIGS. 3A and 3B are plan views respectively showing configuration of resistance elements according to the second prior arts.
Figure 3B:
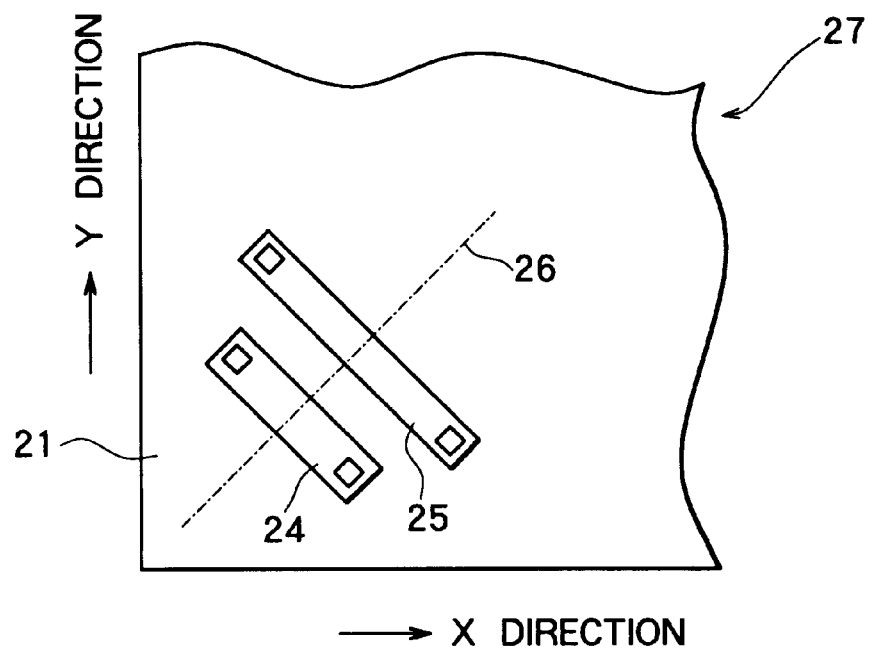
Figure 4A:
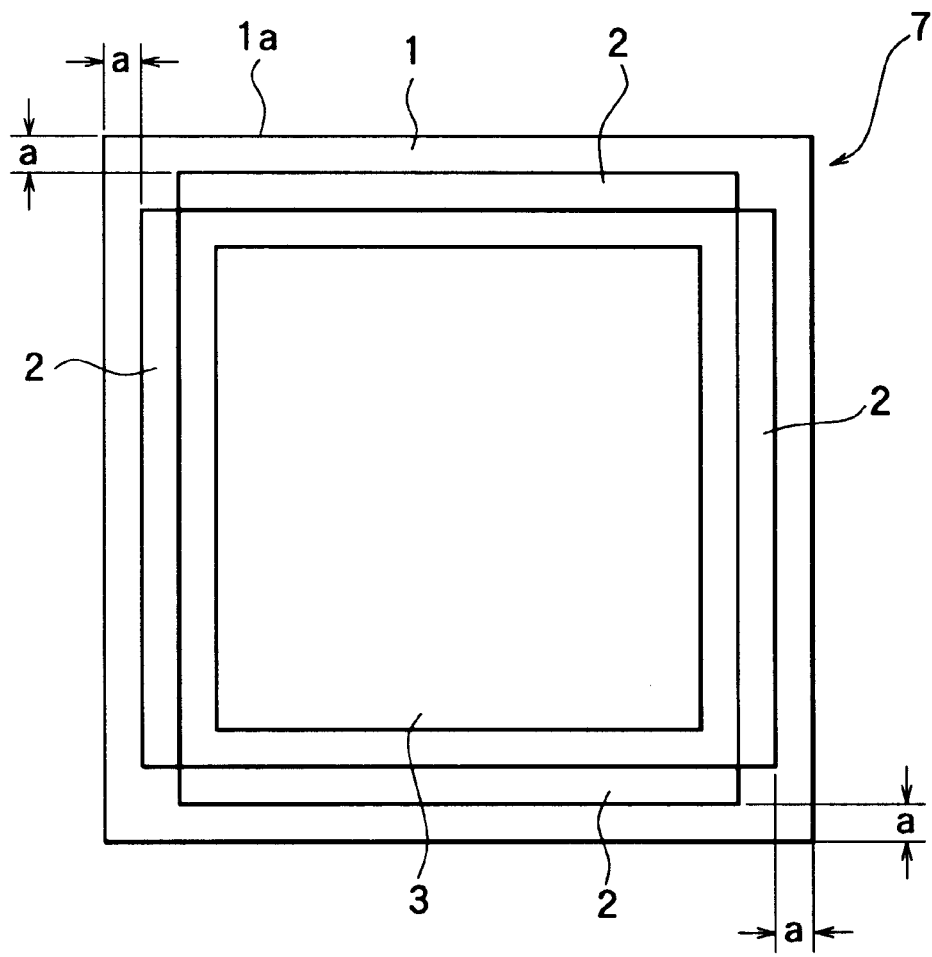
FIG. 4A is a plan view showing a semiconductor integrated circuit device according to the first embodiment of the present invention and FIG. 4B is an enlarged plan view of the resistance element group of FIG. 4A.
Figure 4B:
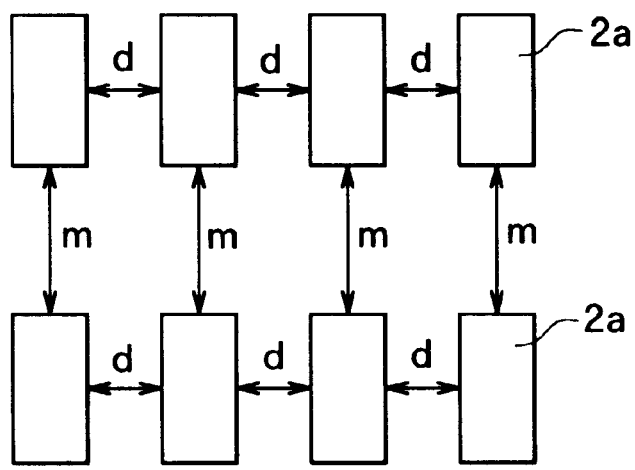

Below, described are embodiments of the present invention in reference to the accompanying drawings in a detailed manner. FIG. 4A is a plan view showing a semiconductor integrated circuit device according to a first embodiment of the present invention and FIG. 4B is an enlarged plan view of the resistance element group of FIG. 4A. As shown in FIG. 4A, a functional circuit group 3 consisting of a plurality of functional circuits is formed at a surface of a substrate 1. Resistance element groups 2 consisting of a plurality of resistance elements connected to functional circuits of the functional circuit group 3 are arranged in four regions outside the functional circuit groups 3, closer to the functional circuit group 3 than to the outer edge 1a of the substrate 1. In such a way, a chip 7 is formed and the chip is mounted on a lead frame (not shown) and thereafter a resin molds the chip, so that a semiconductor integrated circuit device is completed.

In the embodiment, resistance element groups 2 are arranged in a region extending from an inner line, which is distant by one-third of a distance between the outer edge 1a of the substrate 1 and the center thereof from the same outer edge, up to the same outer edge 1a of the substrate 1. Each resistance element group 2 has a rectangular shape extending in a direction parallel to a side of the substrate 1 and is located with a separating distance of a from the outer edge of the substrate 1. Besides, as shown in FIG.4B, each resistance element group 2 is a group in which a plurality of resistance elements 2a each having the same shape and same size, arranged in a constant distance between resistance elements of any adjacent pair, for example, a distance between adjacent two resistance elements 2a along an extending direction of the resistance element group 2 is d and a distance between adjacent two resistance elements 2a along a direction perpendicular to the extending direction of the resistance element group 2 is m.

In the embodiment, since a resistance element group 2 is arranged in the vicinity of the outer edge of the substrate 1, that is, in a region where an influence of a piezoresistance effect is the smallest in the chip 1, a change in resistance value between before and after an assembly process of a package.

In the embodiment, each resistance element group 2 is located at a position remote from the outer edge 1a of the substrate 1 by a predetermined distance a, that is, along a parallel line with an outer edge 1a of the substrate 1. Thereby a dispersion of resistance values among the resistance element groups can be decreased. Besides, in the embodiment, the resistance element groups 2 are arranged in regions extending from an inner line, which is distant by one-third of a distance between the outer edge 1a of the substrate 1 and the center thereof from the same outer edge 1a, up to the same outer edge of the substrate 1. This region is a region where a change rate of a resistance value with respect to a distance from the center of the chip 7 is small. Thus, a dispersion of resistance values of resistance elements 2a in the chip 7 can be further smaller.

A diffused resistor is generally formed by ion implanting an impurity ion in a silicon substrate with use of a photoresist film as a mask. In this case, a pattern made of the photoresist film is generally deformed by its surface tension and if a shape of a resistance element is different, a degree of deformation is also different. In the embodiment, since a shape and size of a resistance element 2a constituting a resistance element group 2 are equal, a degree of deformation is also equal between resistance elements 2a and thereby a dispersion of resistance values among resistance elements 2a can be made small. Deformation is different when a distance between two adjacent resistance elements 2a is different. When a distance between two adjacent resistance elements is smaller, a pattern of the photoresist film is thinner but an element itself grows larger. Therefore, when resistance elements are arranged at a high density and distances between resistance elements are equal to one another, not only a resistance value is decreased but also a dispersion of resistance values can be decreased. As a result, a semiconductor integrated circuit device in which a resistance value after an assembly process of a package is controlled with high accuracy can be obtained.

Figure 5:
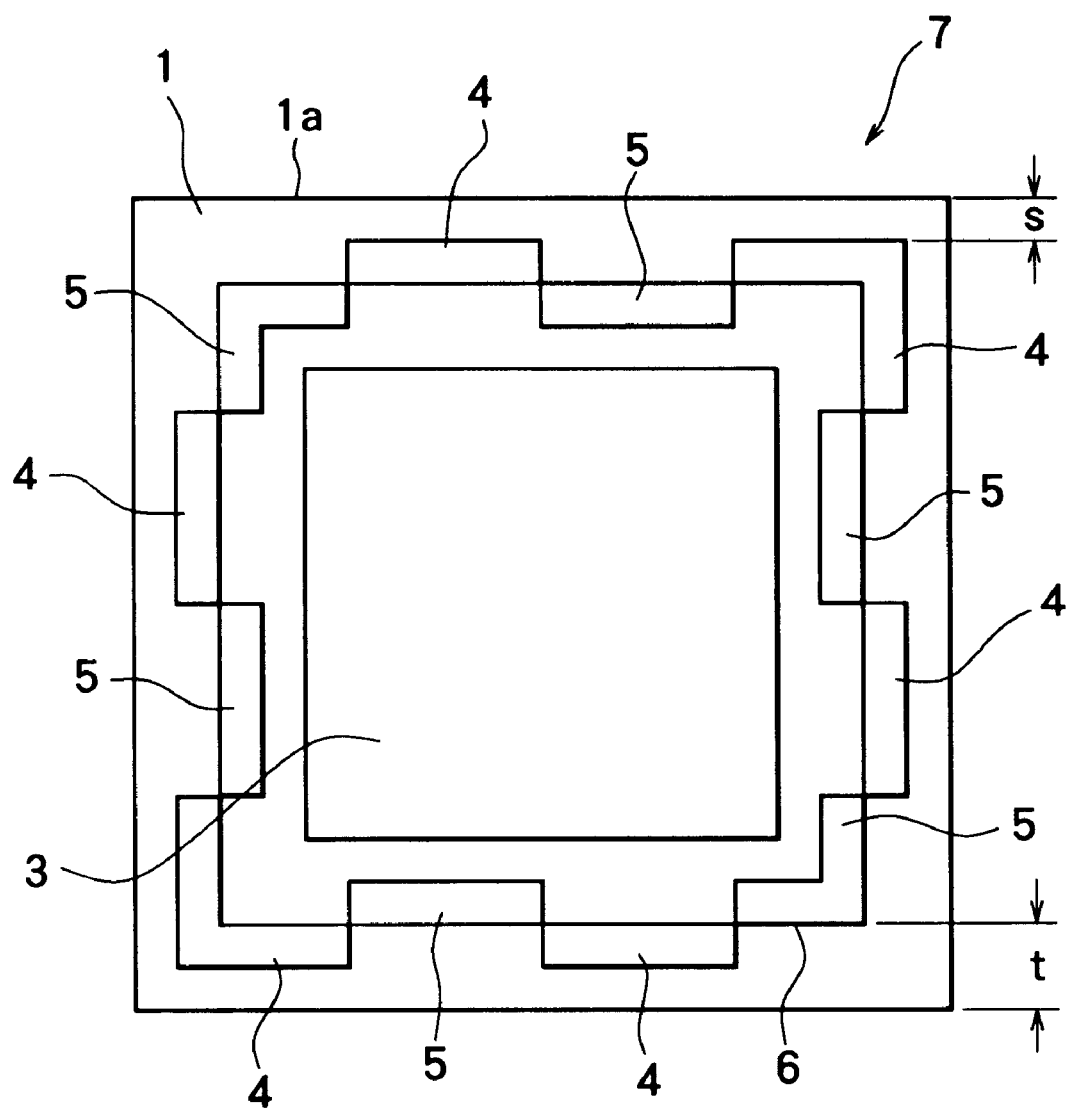
FIG. 5 is a plan view showing a semiconductor integrated circuit device according to the second embodiment of the present invention.

FIG. 5 is a plan view showing a semiconductor integrated device according to a second embodiment of the present invention. In the second embodiment shown in FIG. 5, the same part as that shown in FIG. 4 is attached with the same mark as that shown in FIG. 4 and a detailed description thereof is omitted. As shown in FIG. 5, a functional circuit group 3 consisting of a plurality of functional circuits is formed in a central region of a surface of the substrate 1. Resistance element groups 4 and 5 are respectively arranged along lines 6 each remote from the outer edge 1a of the substrate 1 by a distance of t. In such a way, a chip 7 is formed, the chip 7 is mounted on a lead frame (not shown) and thereafter it is molded by a resin, so that a semiconductor integrated circuit device is completed.

The resistance element groups 5 are arranged inside the line 6 but the resistance element groups 4 are arranged outside the line 6, that is, both resistance element groups 5 and 4 are arranged along the line 6 on both sides thereof alternately. The resistance element groups 4 each are separated from the outer edge 1a of the substrate 1 by a distance of s and the resistance element groups 5 each are separated from the outer edge 1a of the substrate 1 by a distance of t. In a similar way to that in the first embodiment, the resistance element groups each consist of a plurality of resistance elements (not shown).

Even in thus constituted semiconductor integrated circuit device according to the second embodiment, a similar effect to that of the first embodiment can be obtained as well. Since the resistance element groups 4, 5 are arranged on the inside and outside of the line 6 in an alternate manner, for example, an element such as a bipolar transistor can be formed in a space delineated between adjacent resistance element groups 5 created by such an arrangement.

In the first and second embodiments, while resistance element groups each consisting of a plurality of resistance elements are arranged on a substrate, such a structure is not a single structure allowed in a semiconductor integrated circuit device of the present invention. But a resistance element may singly be formed at the outside of a functional circuit group in this invention.

What is claimed is:

1. A semiconductor integrated circuit device having a resistance element, comprising:

a substrate;

a functional circuit group comprising a plurality of functional circuits, said functional circuit group being formed in a central region of the surface of said substrate;

a resistance element group comprising a plurality of resistance elements, said resistance element group being arranged outside said functional circuit group, said resistance elements being connected to said functional circuits, wherein said resistance element group is arranged in a region closer to said functional circuit group than to the outer edge of said substrate.

2. A semiconductor integrated circuit device having a resistance element, comprising:

a substrate;

a functional circuit group comprising a plurality of functional circuits, said functional circuit group being formed in a central region of the surface of said substrate;

a resistance element group comprising a plurality of resistance elements, said resistance element group being arranged outside said functional circuit group, said resistance elements being connected to said functional circuits, wherein said resistance element group is arranged in a region extending from an inner line, which is distance by one-third of a distance between the outer edge of said substrate and the center thereof from the same outer edge, up to the sane outer edge.

3. A semiconductor integrated circuit device having a resistance element, comprising:

a substrate;

a functional circuit group comprising a plurality of functional circuits, said functional circuit group being formed in a central region of the surface of said substrate;

a resistance element group comprising a plurality of resistance elements, said resistance element group being arranged outside said functional circuit group, said resistance elements being connected to said functional circuits, wherein said resistance elements constituting said resistance element group are arranged along a line parallel with an outer edge of said substrate so as to maintain a constant distance between each of two adjacent resistance elements.

4. A semiconductor integrated circuit device according to claim 3, wherein each resistance element of said resistance elements has the same shape and size.

5. A semiconductor integrated circuit having a resistance element, comprising:

a substance;

a functional circuit group comprising a plurality of functional circuits, said functional circuit group being formed in a central region of the surface of said substrate; and a resistance element group comprising a plurality of resistance elements, said resistance element group being arranged outside said functional circuit group and connected to said functional circuit, wherein said resistance element groups are arranged along a line parallel to the outer edge of said substrate on the inside and outside thereof alternately.

6. A semiconductor integrated circuit device according to claim 5, wherein each resistance elements constituting said resistance element group are arranged at a constant distance between two of an adjacent pair.

7. A semiconductor integrated circuit device according to claim 6, wherein each resistance element of said resistance elements has the same shape and size.

8. A semiconductor integrated circuit device having a resistance element, comprising:

a substrate; and a functional circuit formed in a central region of the surface of said substrate; and a resistance element group comprising a plurality of resistance elements, said resistance element group being arranged outside said functional circuit group and connected to said functional circuit, wherein said resistance element is arranged outside said functional circuit in a region closer to said functional circuit than to an outer edge of said substrate and connected with said functional circuit.

9. A semiconductor integrated circuit device having a resistance element, comprising:

a substrate;

a functional circuit group comprising a plurality of functional circuits, said functional circuit group being formed in a central region of the surface of said substrate; and a resistance element group comprising a plurality of resistance elements, said resistance element group being arranged outside said functional circuit group and connected to said functional circuit, wherein said resistance element is arranged in a region extending from an inner line, which is distant by one-third of a distance between the outer edge of said substrate and the center thereof from the same outer edge, up to the same outer edge.

10. A semiconductor device, comprising:

a substrate; and a plurality of resistive elements disposed about the substrate and arranged in groups, wherein the resistive elements of the groups are arranged substantially equidistant from edges of the substrate, with each of the groups of resistive elements arranged in a substantially rectangular area having edges that are substantially parallel to the edges of the substrate, wherein each of the resistive elements of at least one of the groups is spaced a substantially equal distance from neighboring ones of the resistive elements of the at least one group.

11. A semiconductor device, according to claim 10, wherein each group of a first subset of the groups is arranged a first distance from the edges of the substrate and each group of a second subset of the groups is arranged a second distance from the edges of the substrate, and wherein resistive elements of a group of the first subset are displaced relative to resistive elements of a group of the second subset in a direction substantially parallel to a line connecting the resistive elements within the group.

12. A semiconductor device comprising:

a substrate;

a plurality of functional circuits arranged in a central portion of the substrate; and a plurality of resistive elements disposed about the substrate and arranged in groups, wherein the groups of the resistive elements are arranged substantially equidistant from edges of the substrate;

wherein at least one of the groups is arranged closer to the functional circuits than to the edges of the substrate.

13. A method of forming a semiconductor device on a substrate, the method comprising:

forming a plurality of resistive elements about the substrate, with groups of the resistive elements arranged substantially equidistant from edges of the substrate;

wherein forming the resistive elements includes spacing each of the resistive elements of at least one of the groups a substantially equal distance from neighboring ones of the resistive elements of the at least one group.

14. A method of forming a semiconductor device, according to claim 13, wherein forming a plurality of resistive elements includes forming a first subset of the group of resistive elements at a first distance from the edges of the substrate and forming a second subset of the groups of resistive elements at a second distance from the edges of the substrate, and displacing resistive elements of a group of the first subset relative to resistive elements of a group of the second subset in a direction substantially parallel to a line connecting the resistive elements within a group.

15. A method of forming a semiconductor device, on a substrate, the method comprising:

forming a plurality of functional circuit elements in a central portion of the substrate; and forming a plurality of resistive elements about the substrate wherein groups of the resistive elements are arranged substantially equidistant from edges of the substrate, wherein forming the resistive elements includes arranging at least one of the groups of resistive elements in a region closer to the functional circuit elements than to an edge of the substrate.

16. A method of forming a semiconductor device on a substrate, the method comprising:

forming a plurality of resistive elements about the substrate, wherein groups of the resistive elements are arranged substantially equidistant from edges to the substrate, wherein forming the resistive elements includes forming resistive elements of at least one of the groups that have substantially the same size and shape as other ones of the resistive elements of the at least one group.

* * * * *